United States Patent
Kang et al.

(10) Patent No.: US 9,590,628 B2
(45) Date of Patent: Mar. 7, 2017

(54) REFERENCE VOLTAGE TRAINING DEVICE AND METHOD THEREOF

(71) Applicant: Samsung Electronics Co., Ltd., Suwon-si (KR)

(72) Inventors: SukYong Kang, Suwon-si (KR); Hun-Dae Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/976,716

(22) Filed: Dec. 21, 2015

(65) Prior Publication Data

US 2016/0197611 A1   Jul. 7, 2016

(30) Foreign Application Priority Data

Jan. 2, 2015   (KR) .................. 10-2015-0000046

(51) Int. Cl.
| | | |
|---|---|---|
| G11C 7/22 | (2006.01) | |
| G11C 7/10 | (2006.01) | |
| G11C 7/06 | (2006.01) | |
| G11C 11/4076 | (2006.01) | |
| G11C 11/406 | (2006.01) | |
| H03K 19/0175 | (2006.01) | |
| G11C 5/14 | (2006.01) | |
| G11C 7/14 | (2006.01) | |
| G11C 29/02 | (2006.01) | |
| G11C 7/12 | (2006.01) | |

(52) U.S. Cl.
CPC ..... *H03K 19/017509* (2013.01); *G11C 5/147* (2013.01); *G11C 7/14* (2013.01); *G11C 7/062* (2013.01); *G11C 7/1084* (2013.01); *G11C 7/12* (2013.01); *G11C 7/22* (2013.01); *G11C 7/222* (2013.01); *G11C 29/028* (2013.01); *G11C 2207/2254* (2013.01)

(58) Field of Classification Search
CPC ......... G11C 7/222; G11C 7/22; G11C 29/028; G11C 7/12; G11C 7/062; G11C 5/147
USPC ........................................ 365/189.07, 189.09
See application file for complete search history.

(56) References Cited

U.S. PATENT DOCUMENTS

| | | |
|---|---|---|
| 7,456,651 B2 | 11/2008 | Lee |
| 7,647,467 B1 | 1/2010 | Hutsell et al. |
| 7,991,098 B2 | 8/2011 | Hollis |
| 8,102,724 B2 | 1/2012 | Fox et al. |
| 8,599,967 B2 | 12/2013 | Hollis |

(Continued)

FOREIGN PATENT DOCUMENTS

KR   10-2010-00061753   6/2012

*Primary Examiner* — Ly D Pham
(74) *Attorney, Agent, or Firm* — Muir Patent Law, PLLC

(57) ABSTRACT

Provided are a reference voltage training device and a method thereof. The reference voltage training device includes a comparator configured to compare a toggle signal with a reference voltage and output a comparison signal, a duty cycle detector configured to check a duty ratio of the comparison signal, and a reference voltage level changing unit configured to fix the reference voltage when the duty ratio meets a predetermined condition and to change a level of the reference voltage when the duty ratio does not meet the predetermined condition. The comparator outputs a changed comparison signal using the changed reference voltage.

20 Claims, 17 Drawing Sheets

(56) References Cited

U.S. PATENT DOCUMENTS

| | | |
|---|---|---|
| 8,649,229 B2 | 2/2014 | Vergis et al. |
| 8,659,962 B2 | 2/2014 | Lee |
| 8,680,841 B2 | 3/2014 | Lee et al. |
| 8,817,914 B2 * | 8/2014 | Shawwa .............. H03K 5/1565 327/171 |
| 8,850,155 B2 | 9/2014 | Brandl et al. |
| 2005/0007168 A1 * | 1/2005 | Park .................... H03K 5/1565 327/175 |
| 2006/0083037 A1 * | 4/2006 | Leung ............... H02M 3/33576 363/98 |
| 2007/0252622 A1 * | 11/2007 | Saenz ................... H03K 5/086 327/72 |
| 2010/0325372 A1 | 12/2010 | Housty et al. |
| 2011/0273192 A1 * | 11/2011 | Huang ................... G06F 3/044 324/678 |
| 2012/0008431 A1 | 1/2012 | Lee |
| 2012/0147679 A1 | 6/2012 | Lee |
| 2013/0154702 A1 * | 6/2013 | Kim ....................... H03L 7/089 327/158 |
| 2014/0226398 A1 | 8/2014 | Desireddi et al. |
| 2015/0312981 A1 * | 10/2015 | Zhang .................. H02M 3/156 315/224 |
| 2015/0381034 A1 * | 12/2015 | Chiu ...................... H02M 1/14 327/536 |
| 2016/0035411 A1 * | 2/2016 | Yu ....................... G11C 11/4091 365/189.07 |

* cited by examiner

FIG. 13

< Vref : Vmin ⇒ Vmax >

| CODE | DUTY RETIO | INCREASE AND DECREASE | FILTERING |
|------|------------|----------------------|-----------|
| 0010 | 62 | | |
| 0011 | 57 | ← DECREASE | ← PASS |
| 0100 | 49 | ← DECREASE | ← PASS |
| 0101 | 51 | ← INCREASE | ← FILTERING |

FIG. 14

< Vref : Vmax ⇒ Vmin >

| CODE | DUTY CYCLE | INCREASE AND DECREASE | FILTERING |
|------|------------|----------------------|-----------|
| 0010 | 38 | | |
| 0011 | 45 | ← INCREASE | ← PASS |
| 0100 | 51 | ← INCREASE | ← PASS |
| 0101 | 49 | ← DECREASE | ← FILTERING |

REFERENCE VOLTAGE TRAINING DEVICE AND METHOD THEREOF

CROSS-REFERENCE TO RELATED APPLICATIONS

This application claims priority under 35 U.S.C. §119 to Korean Patent Application No. 10-2015-0000046, filed Jan. 2, 2015, in the Korean Intellectual Property Office, the disclosure of which is incorporated herein by reference in its entirety.

BACKGROUND

The present disclosure relates to a reference voltage training device and a method thereof.

A reference voltage is used to determine logic level of a digital signal. Because this reference voltage may be directly related to reliability of data and accuracy of computation, accurate training of the reference voltage may be important in a computing device.

Conventionally, a maximum value of a reference voltage to detect a high data value, and a minimum value of the reference voltage to detect a low data value are determined through a test procedure to find a middle value for the reference voltage. Alternatively, a reference voltage may be determined through a training sequence which includes: writing data of a certain pattern, reading the written data again, and comparing the written data with the read data.

Such a training sequence may result in complicated circuits and an increase of manufacturing costs.

SUMMARY

According to an aspect of the present disclosure, there is provided a reference voltage training device comprising: a comparator configured to compare a toggle signal with a reference voltage and output a comparison signal, a duty cycle detector configured to measure a duty ratio of the comparison signal, and a reference voltage level changing unit configured to fix the reference voltage when the duty ratio meets a predetermined condition and, when the duty ratio does not meet the predetermined condition, to modify the reference voltage in accordance with the measured duty ratio and output a changed reference voltage wherein the comparator outputs a changed comparison signal using the changed reference voltage. Modifying the reference voltage may be continued until the duty ratio of the comparison signal meets a predetermined condition.

According to another aspect of the present disclosure, there is provided a reference voltage training device comprising: a reference voltage level changing unit configured to change a level of a reference voltage to a predetermined level, a comparator configured to compare the reference voltage with a toggle signal and output a comparison signal, a phase converter configured to shift a phase of the comparison signal and output an inverted phase signal, and a duty cycle detector configured to check a duty ratio of the comparison signal by comparing the comparison signal with the inverted phase signal, wherein the reference voltage is fixed to a last reference voltage when the duty ratio is located within predetermined condition.

According to still another aspect of the present disclosure, there is provided a reference voltage training device comprising: a memory configured to include a reference voltage training device and a memory controller configured to transmit a toggle signal to the reference voltage training device, wherein the reference voltage training device compares the toggle signal with an initial reference voltage and outputs a comparison signal, checks a duty ratio of the comparison signal, fixes the initial reference voltage to a reference voltage when the duty ratio meets a predetermined condition, and changes the initial reference voltage when the duty ratio does not meet the predetermined condition and outputs a changed comparison signal.

BRIEF DESCRIPTION OF THE DRAWINGS

Exemplary embodiments of the disclosure will be more clearly understood from the following detailed description taken in conjunction with the accompanying drawings, in which:

FIG. 13 is one exemplary table illustrating an exemplary operation of the digital filter of FIG. 12;

FIG. 14 is another exemplary table illustrating an exemplary operation of the digital filter of FIG. 12;

DETAILED DESCRIPTION

Figure 1:
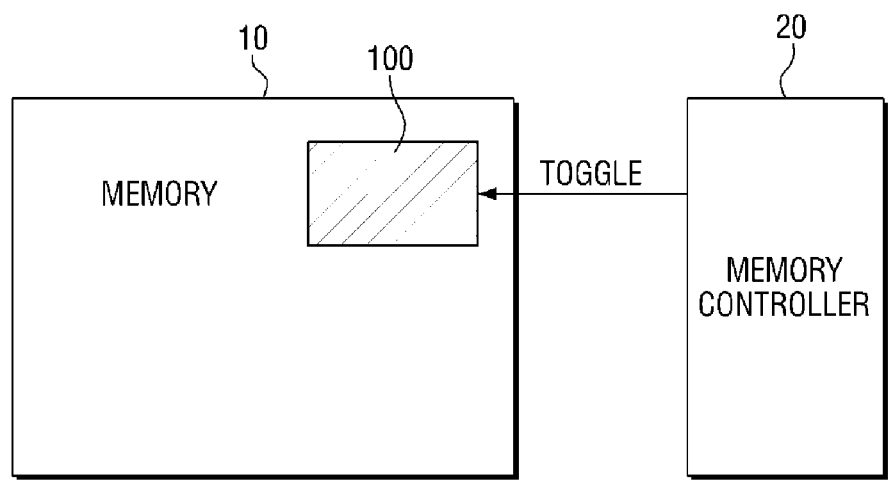
FIG. 1 is a block diagram illustrating a reference voltage training device according to an exemplary embodiment.

Advantages and features of the present disclosure may be understood more readily by reference to the following detailed description of preferred embodiments and the accompanying drawings. The present disclosure may, however, be embodied in many different forms and should not be construed as being limited to the embodiments set forth herein. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. Unless the context indicates otherwise, these terms are only used to distinguish one element from another element. Thus, for example, a first element, a first component or a first section discussed below could be termed a second element, a second component or a second section without departing from the teachings of the present disclosure. In addition, in certain cases, even if a term is not described using "first," "second," etc. in the specification, it may still be referred to as "first" or "second" in a claim in order to distinguish difference claimed elements from each other.

As used herein, a semiconductor device may refer to any of the various devices such as shown in the attached figures, and may also refer, for example, to one or more transistors, logic devices, or cell arrays, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera or other consumer electronic device, etc.

The present disclosure will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present disclosure but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a description will be given for a reference voltage training device according to an exemplary embodiment of the present disclosure with reference to FIG. 1.

Referring to FIG. 1, the reference voltage training device denoted by 100 may be included in a memory 10. The memory 10 may operate under control of a memory controller 20.

The memory 10 may store data. Data may be written into and read out from the memory 10 through write and read operation. The memory 10 may perform the write and read operation under control of the memory controller 20. For example, the memory 10 may perform the write and read operation for the memory controller 20.

The memory 10 may be, for example, a random access memory (RAM), a read only memory (ROM) or a flash memory. As long as a memory device uses a reference voltage, the scope and spirit of the present disclosure may not be limited to a kind of the memory 10.

The memory controller 20 may control the write and read operation of the memory 10. The memory controller 20 may perform write operations to store data in the memory 10 and may perform read operations to read out data from the memory 10.

The memory controller 20 may transmit a toggle signal to the memory 10. The toggle signal may be a digital signal, and may mean a signal where "0" and "1" are repeated. For example, the toggle signal may be a signal where a high level and a low level are repeated continuously, such as "1010".

The memory 10 includes the first reference voltage training device 100. The first reference voltage training device 100 may receive the toggle signal from the memory controller 20. The first reference voltage training device 100 may train a reference voltage using the toggle signal. The reference voltage is used to determine the logic level of the toggle signal.

The reference voltage may be set in a range to distinguish the high and low level of data, that is, "1" and "0," which are digital signals. A first reference voltage supplied from the outside may not be used without change. This is because the first reference voltage in the memory 10 may not correctly distinguish the level of data in the memory 10. Accordingly, a training process of the reference voltage may be utilized to modify the reference voltage for correct data reading.

The first reference voltage training device 100 according to an exemplary embodiment of the present disclosure may be located in the memory 10, and may receive only the toggle signal and may train an internal reference voltage for itself.

Because it is unnecessary for the first reference voltage training device 100 to perform the step of reading or writing data for training the reference voltage, data computation speed of the memory 10 is enhanced.

Though the first reference voltage training device 100 is used in the memory 10 in this embodiment, the scope of the present disclosure is not limited thereto. For example, the first reference voltage training device 100 according to an exemplary embodiment of the present disclosure may be located in another device which uses a reference voltage, rather than the memory 10 and the memory controller 20, to train the reference voltage.

Figure 2:
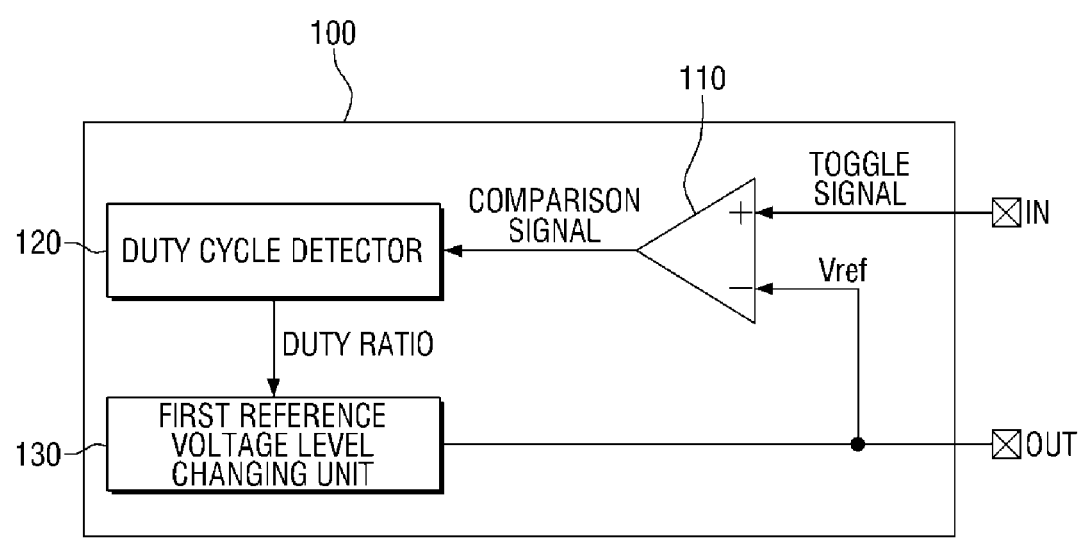
FIG. 2 is a block diagram illustrating a detailed configuration of a reference voltage training device according to one exemplary embodiment.

Referring to FIG. 2, a first reference voltage training device 100 according to one exemplary embodiment of the present disclosure may include a comparator 110, a duty cycle detector 120, and a first reference voltage level changing unit 130.

The comparator 110 may receive two signals at its input terminals. The comparator 110 may generate one output by comparing the two input signals. In more detail, the comparator 110 may receive a toggle signal and a reference voltage Vref and may output a comparison signal.

The toggle signal may be a signal whose logic levels vary repeatedly between "1" and "0". The reference voltage Vref may be a signal having a certain voltage value. Accordingly, the comparison signal generated by comparing the toggle signal with the reference voltage Vref may be a signal where "1" and "0" are basically repeated. Herein, when the reference voltage Vref is lower than a minimum value of the toggle signal or is higher than a maximum value of the toggle signal, "0" or "1" may be continuously output without repeating "1" and "0". Except for this case, the comparison signal may be a signal where "0" and "1" are repeated.

Because the reference voltage Vref may be continuously modified in level by the first reference voltage level changing unit 130, the comparison signal may also be changed accordingly, thereby changing a duty ratio of a waveform of the comparison signal.

The duty cycle detector 120 may receive the comparison signal. The duty cycle detector 120 may measure a duty ratio of the comparison signal. The duty ratio may be a ratio of time between logic level of high and logic level of low of a signal during a toggling period of the signal such as the comparison signal. For example, the duty ratio may refer to the proportion of time when the comparison signal remains high or low in level during a toggling period.

The duty cycle detector 120 may measure the duty ratio of the comparison signal and may transmit the duty ratio to the first reference voltage level changing unit 130 as an analog signal. The scope and spirit of the present disclosure may not be limited thereto. For example, the duty ratio may be transmitted as a digital signal.

The first reference voltage level changing unit 130 may receive the duty ratio from the duty cycle detector 120. The first reference voltage level changing unit 130 may change a level of the reference voltage in accordance with the duty ratio unless the duty ratio is within predetermined conditions.

The predetermined conditions may include a condition where the duty ratio is located within a reference range. The reference range may be a predetermined range. The reference range may be 50%.

In more detail, the reference voltage may be suitable when the duty ratio is 50%. The comparison between the reference voltage and the toggle may be performed by a predetermined periodic strobe. Maximum margin for both logic level high and logic level low of the toggling signal may be achieved through the periodic comparison by staying within the reference range of 50% of the duty ratio.

The first reference voltage level changing unit 130 may change a level of the reference voltage in only one direction. For example, after the first reference voltage level changing unit 130 sets an initial reference voltage to a minimum value, it may change a level of the reference value to a maximum value by gradually increasing a level of the reference voltage.

In contrast, after the first reference voltage level changing unit 130 sets an initial reference voltage to a maximum value, it may change the reference value to a minimum value by gradually decreasing a level of the reference voltage. For example, the reference voltage may be changed in a direction, e.g., an increasing direction or a decreasing direction.

When the initial reference voltage is set to the minimum value and a level of the reference voltage is gradually increased, a duty ratio may be continuously decreased from 100%. Therefore, because one of the times the duty ratio is within the 50% range is when the duty ratio is first 50% or less, then the reference voltage may be used as a last reference voltage.

When the initial reference voltage is set to the maximum value and a level of the reference voltage is gradually decreased, a duty ratio may be continuously increased from 0%. Therefore, because one of the times the duty ratio is within the 50% range is when the duty ratio is first 50% or more, then the reference voltage may be used as a last reference voltage.

Herein, the scope and spirit of the present disclosure may not be limited to 50%. For example, another range of a duty ratio may also become standard according to a desired circuit condition.

For example, the duty cycle detector 120 may measure the duty ratio until the duty ratio meets a predetermined condition. The first reference voltage level changing unit 130 may change a level of the reference voltage in accordance with a measured duty ratio. When the duty ratio meets the predetermined condition, the first reference voltage level changing unit 130 may stop changing the level of the reference voltage and the training of the reference voltage.

Hereinafter, a description will be given for an operation of a comparator to generate a comparison signal with reference to FIGS. 3 and 4.

Figure 3:
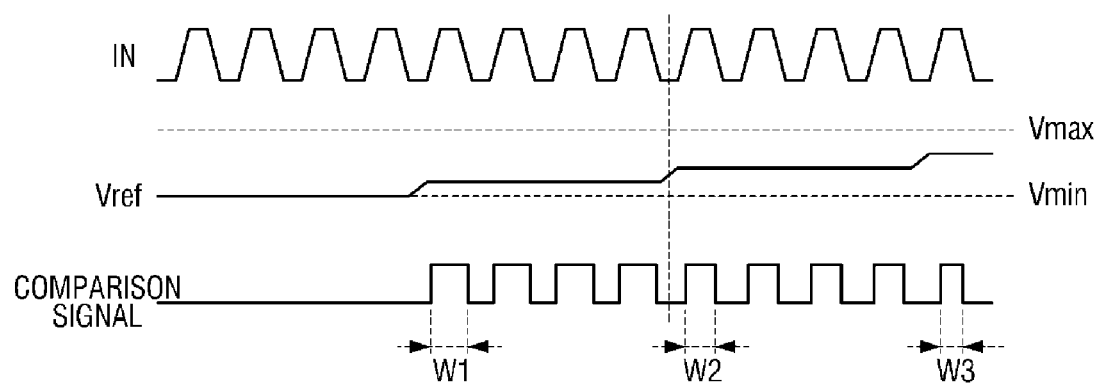
FIG. 3 is a time diagram illustrating an example operation of a reference voltage training device of FIG. 2.

Referring to FIG. 3, a toggle signal IN and a reference voltage Vref may be input to input terminals of a comparator 110. In embodiments, the toggle signal IN may have a shape of a square wave. However, the actual toggle signal IN may have a transitory slope between a high level and a low level. Accordingly, the waveform of the toggle signal IN may be a trapezoid shape or sinusoidal shape rather than a square-wave shape.

The reference voltage Vref initially may have either a minimum value or a maximum value. However, hereinafter, for better understanding and ease of description, it is assumed that the reference voltage Vref has the minimum value. The reference voltage Vref may be gradually increased until a duty ratio of the comparison signal becomes 50%.

A description will be given for an operation of generating a comparison signal with reference to FIG. 4.

Figure 4:
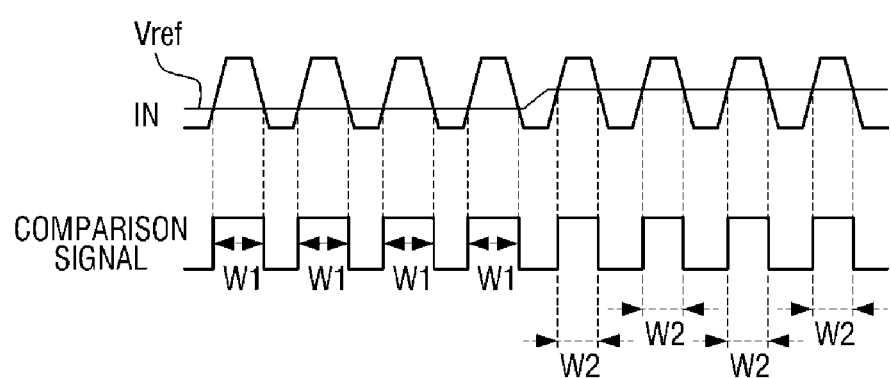
FIG. 4 is a exemplary time diagram illustrating a comparison signal of FIG. 3.

Referring to FIG. 4, when a reference voltage Vref and a toggle signal IN are overlapped with each other, the comparison signal may be represented as a high-level signal in a portion where the toggle signal IN is higher than the reference voltage Vref and it may be represented as a low-level signal in a portion where the toggle signal IN is lower than the reference voltage Vref.

Because the toggle signal IN is not a perfect square wave but a waveform having a slope between a high-level signal and a low-level signal, a duty ratio of the comparison signal may be gradually decreased as the reference voltage Vref is increased. For example, as the reference voltage Vref is increased, the high-level portion of the signal may become narrower. Because the lengths of the period of toggle signal IN and comparison signal may be identical and consistent with each other, the low-level portion of signals W1 to W3 may become wider as the high-level portion of the signal becomes narrower.

Accordingly, a duty ratio of the comparison signal may be gradually decreased from 100% to 0%. A first reference voltage training device 100 (refer to FIG. 2) according to an exemplary embodiment of the present disclosure may complete the training of a reference voltage when this duty ratio is the closest to 50% and may acquire an optimal margin point for discriminating data.

Because it is unnecessary to perform a data receiving stage such as a data read or write operation from the outside, the first reference voltage training device 100 according to an exemplary embodiment of the present disclosure may shorten time corresponding to the data receiving stage. Accordingly, the first reference voltage training device 100 may train a reference voltage at a faster speed.

In addition, because it is unnecessary to receive a signal from the outside except for the toggle signal, the first reference voltage training device 100 according to an exemplary embodiment of the present disclosure may compensate for an error in mismatch between inter symbol interference (ISI) and on-die-termination (ODT), which may result in improved accuracy and speed of the first reference voltage training device 100.

Hereinafter, a description will be given for a second reference voltage training device 101 according to another exemplary embodiment of the present disclosure with reference to FIGS. 5 to 8. Because the second reference training device denoted by 101 includes the same configurations as a first reference voltage training device 100 (refer to FIG. 2) except for a phase converter 140, a description thereof will thus be omitted or briefly described.

Figure 5:
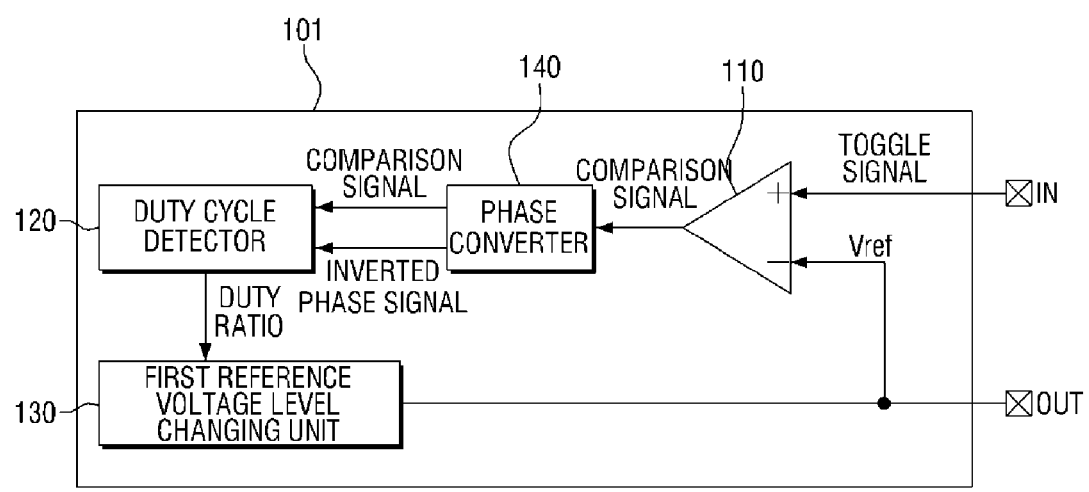
FIG. 5 is a block diagram illustrating a configuration of a reference voltage training device according to another exemplary embodiment.

Referring to FIG. 5, the second reference voltage training device 101 according to another exemplary embodiment of the present disclosure may further include the phase converter 140.

The phase converter 140 may receive a comparison signal from a comparator 110. The phase converter 140 may output a phase inverted signal of the comparison signal. The phase inverted signal may be generated by shifting the comparison signal by 180 degrees in phase.

Figure 6:
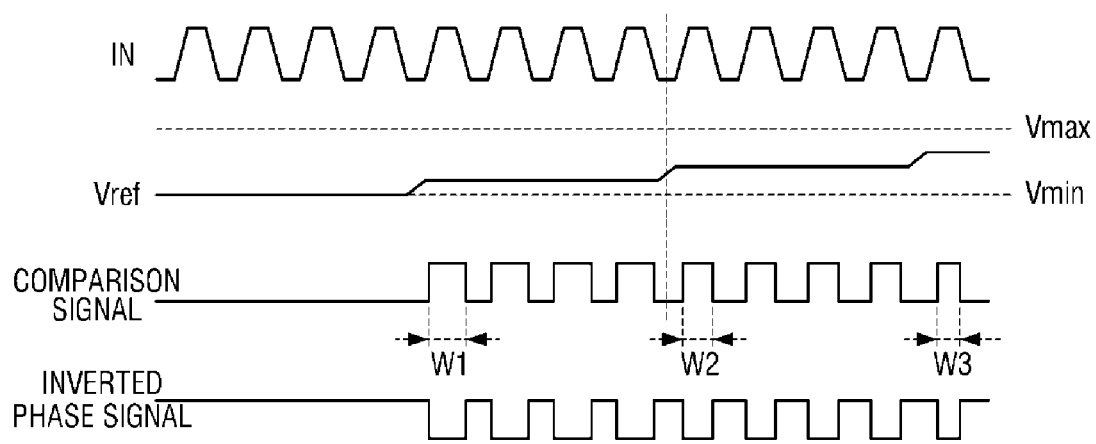
FIG. 6 is a time diagram illustrating an exemplary operation of the reference voltage training device of FIG. 5.

Referring to FIG. 6, an inverted phase signal is a signal in which a comparison signal is inverted. For example, a high-level signal of the comparison signal may correspond to a low-level signal in the inverted phase signal. In contrast, a low-level signal of the comparison signal may correspond to a high-level signal in the inverted phase signal.

Referring back to FIG. 5, the phase converter 140 may transmit the comparison signal and the inverted phase signal to a duty cycle detector 120. The duty cycle detector 120 may check a duty ratio of the comparison signal using the comparison signal and the inverted phase signal.

Figure 7:
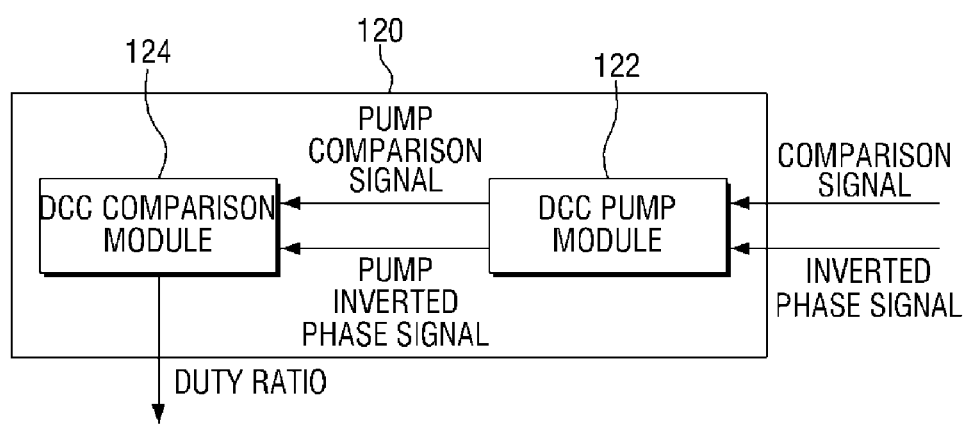
FIG. 7 is a block diagram illustrating a exemplary configuration of the duty cycle detector of FIG. 5.

Referring to FIG. 7, the duty cycle detector denoted by 120 may include a duty ratio correction (DCC) pump module 122 and a DCC comparison module 124. DCC pump module 122 and DCC comparison module 124 may include one or more electronic circuits and or devices.

The DCC pump module 122 may receive a comparison signal and an inverted phase signal from a phase converter 140 (refer to FIG. 5). The DCC pump module 122 may boost the comparison signal and the inverted phase signal. For example, the DCC pump module 122 may convert levels of the comparison signal and the inverted phase signal into higher levels or lower levels by amplifying the comparison signal and the inverted phase signal.

The comparison signal and the inverted phase signal may be amplified by the DCC pump module 122 to be compared with each other. Herein, an amplified rate may be preset. The scope and spirit of the present disclosure may not be limited thereto.

The DCC comparison module 124 may check a duty ratio by comparing the boosted comparison signal with the boosted inverted phase signal. The DCC comparison module 124 may output information about the duty ratio as an analog signal. The scope and spirit of the present disclosure may not be limited thereto. For example, the DCC comparison module 124 may output a digital signal about whether the duty ratio meets a predetermined condition.

Figure 8:
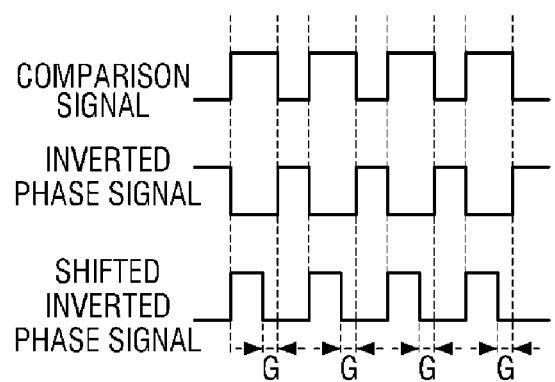
FIG. 8 is a time diagram illustrating an exemplary operation of a duty ratio correction (DCC) comparison module of FIG. 7.

Referring to FIG. 8, a DCC comparison module 124 (refer to FIG. 7) may compare a comparison signal with an inverted phase signal. In more detail, the DCC comparison module 124 may shift the inverted phase signal to align a rising edge of the comparison signal and a rising edge of the inverted phase signal. However, the scope and spirit of the present disclosure may not be limited thereto. For example, when the rising edge of the comparison signal and the rising edge of the inverted phase signal may be aligned, it is fine that the comparison signal rather than the inverted phase signal is shifted.

The shifted inverted phase signal may have a gap G with the comparison signal in a high-level interval. The smaller the gap G, the closer a duty ratio of the comparison signal is to 50%. The larger the gap G, the farther the duty ratio of the comparison signal is from 50%. For example, the DCC comparison module 124 may detect the duty ratio according to a ratio of the gap G to a period.

Hereinafter, a description will be given for a first reference voltage level changing unit of a reference voltage training device according to one exemplary embodiment of the present disclosure with reference to FIGS. 9 to 11.

Figure 9:
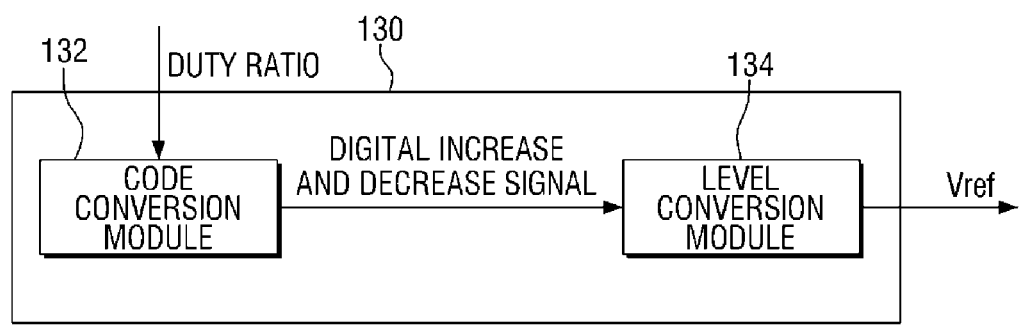
FIG. 9 is a block diagram illustrating a reference voltage level changing unit of a reference voltage training device according to one exemplary embodiment.

Referring to FIG. 9, a first reference voltage level changing unit 130 (refer to FIGS. 2 and 5) may include a code conversion module 132 and a level conversion module 134.

The code conversion module 132 may receive a duty ratio. The code conversion module 132 may receive the duty ratio and may generate a digital increase and decrease signal. The code conversion module 132 may transmit the digital increase and decrease signal to the level conversion module 134.

The code conversion module 132 may receive the duty ratio as an analog signal. Accordingly, the code conversion module 132 may determine whether the duty ratio meets a predetermined condition and may change the duty ratio from the analog signal to a digital signal.

As one example, because a duty ratio is initially 100% when a reference voltage Vref is first set to a minimum value and is then gradually increased, the predetermined condition may be set such that the duty ratio is 50% or less. For example, the code conversion module 132 may generate the digital increase and decrease signal until the duty ratio is 50% or less. The digital increase and decrease signal may be a signal for increasing or decreasing the reference voltage Vref. As such, when the reference voltage Vref is gradually increased, the digital increase and decrease signal may be a signal for increasing the reference voltage Vref.

When the duty ratio is first 50% or less, the code conversion module 132 may determine the reference voltage Vref at that time as the voltage having an optimum margin point and may not generate the digital increase and decrease signal. Accordingly, the reference voltage Vref may no longer be changed.

As another example, because a duty ratio is initially 0% when a reference voltage Vref is first set to a maximum value and is then gradually decreased, the predetermined condition may be set such that the duty ratio is 50% or more. For example, the code conversion module 132 may generate the digital increase and decrease signal until the duty ratio is 50% or more. The digital increase and decrease signal may be a signal for increasing or decreasing the reference voltage Vref. When the reference voltage Vref is gradually decreased, the digital increase and decrease signal may be a signal for decreasing the reference voltage Vref.

When the duty ratio is 50% or more, the code conversion module 132 may determine the reference voltage Vref at that time as a voltage having an optimum margin point and may stop generating the digital increase and decrease signal. Accordingly, the reference voltage Vref may no longer be changed.

The duty ratio may be transmitted as a digital signal rather than an analog signal. For example, only information about whether the duty ratio meets the predetermined condition may be transmitted as a digital signal. For example, whether the duty ratio meets the predetermined condition may be determined by a duty cycle detector 120 (refer to FIGS. 2 and 5), and may also be determined by the first reference voltage level changing unit 130.

Receiving the signal about the duty ratio and determining that the duty ratio does not meet the predetermined condition, the code conversion module 132 may generate the digital increase and decrease signal. The digital increase and decrease signal may be a digitally coded signal. A description will be later given in detail for this.

The level conversion module 134 may receive the digital increase and decrease signal. The level conversion module 134 converts a level of a reference voltage Vref according to the digital increase and decrease signal. Herein, a level of the reference voltage, corresponding to the digital increase and decrease signal, may be preset. Accordingly, when the digital increase and decrease signal is transmitted to the level conversion module 134, the level conversion module 134 may output the reference voltage Vref of the level corresponding to the digital increase and decrease signal.

The output reference voltage Vref may be input to input terminals of a comparator 110 (refer to FIGS. 2 and 5). Accordingly, the comparator 110 may output a changed comparison signal according to the changed reference voltage Vref. A duty cycle detector 120 (refer to FIGS. 2 and 5) may check a duty ratio of the changed comparison signal again and may transmit the checked result to the first reference voltage level changing unit 130 again. Therefore, the first reference voltage level changing unit 130 may change a level of the reference voltage Vref according to the duty ratio until the duty ratio meets the predetermined condition. Alternatively, the first reference voltage level changing unit 130 may fix a level of the reference voltage Vref by completing reference voltage training.

Figure 10:
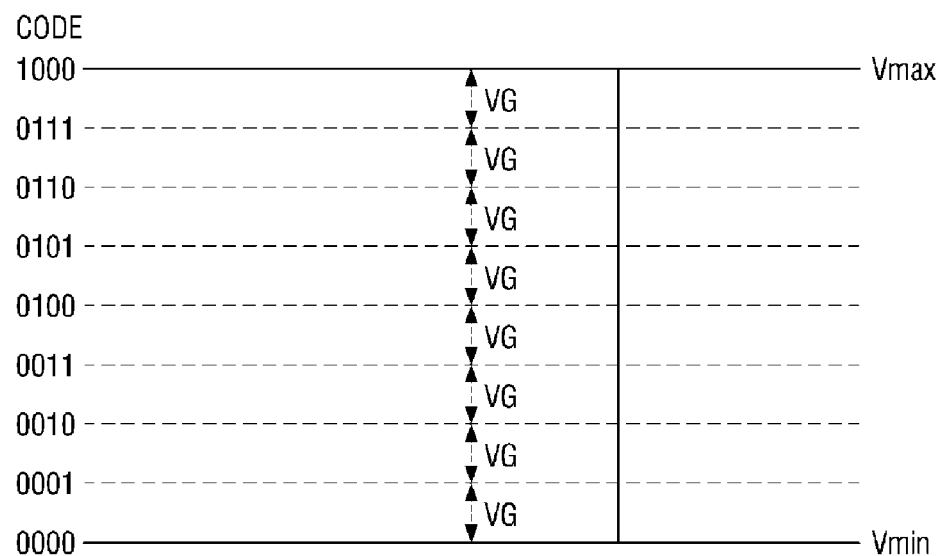
FIG. 10 is a drawing illustrating an interval of a reference voltage changed according to the code conversion module of FIG. 9 according to one exemplary embodiment.

Referring to FIG. 10, a level conversion module 134 (refer to FIG. 9) may receive a code from a code conversion module 132 (refer to FIG. 9) and may set a reference voltage corresponding to the received code. Herein, the code may be a digital code. The code may also be a code using a plurality of bits. In FIG. 10, 4 bits are used to represent 9 levels. The scope and spirit of the present disclosure may not be limited thereto. For example, the number of levels and the number of bits of codes may not be limited thereto in the code conversion module 132. Accordingly, the code conversion module 132 may use a plurality of bits which may represent a plurality of codes for representing a plurality of levels.

When a duty ratio does not meet a predetermined condition, the code conversion module 132 may convert a code. Herein, if a reference voltage is set in a direction of increase, the code conversion module 132 may increase the code at intervals of each step. The code may be a digitally coded code. The code conversion module 132 may set a level of the reference voltage to a corresponding level between the minimum value Vmin and the maximum value Vmax according to the code. For example, the level may be discontinuously increased according to a predefined or constant time interval.

In contrast, if a reference voltage is set in a direction of decrease, the code conversion module 132 may decrease the code at intervals of each step. The code may be a digitally coded code. The code conversion module 132 may set a level of the reference voltage to a corresponding level between the minimum value Vmin and the maximum value Vmax according to the code. For example, the level may be discontinuously decreased according to a predefined or constant time interval.

Herein, the code conversion module 132 may increase or decrease the code at intervals of each step. Accordingly, first and second reference voltage training devices 100 and 101 (referring to FIGS. 2 and 5) may detect an optimized duty ratio.

As shown in FIG. 10, a reference voltage Vref may be set in advance to correspond to codes at a certain interval VG. As such, when the reference voltage Vref is changed at the certain interval VG, a reference voltage Vref having an optimum duty ratio may be detected intuitively and simply, thereby minimizing an amount of computation therefor.

Figure 11:
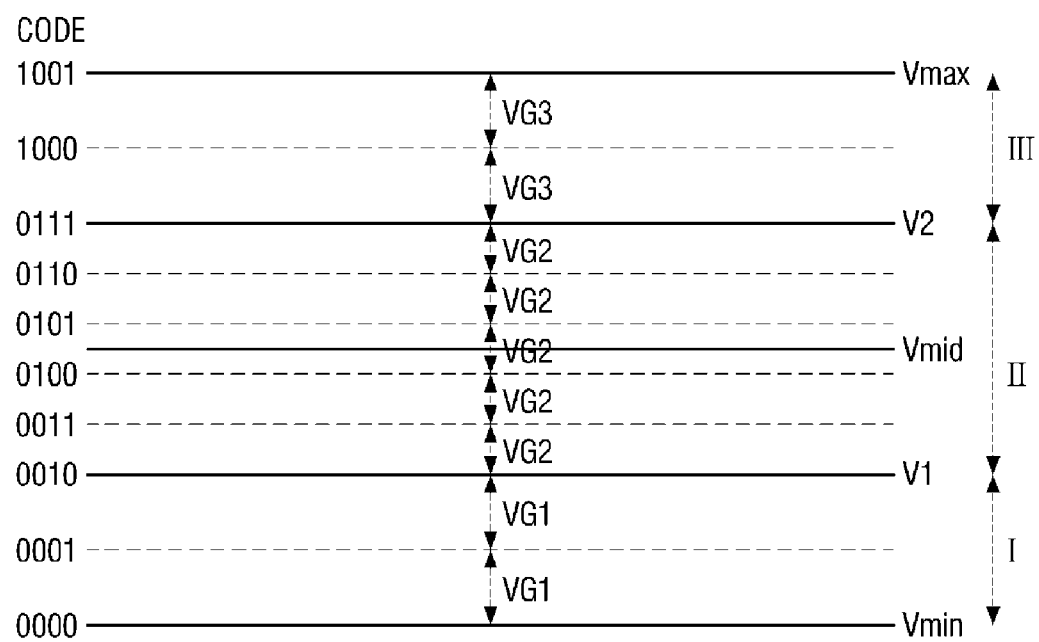
FIG. 11 is a drawing illustrating an interval of a reference voltage changed according to the code conversion module of FIG. 9 according to another exemplary embodiment.

Referring to FIG. 11, a level of a reference voltage Vref may be set at different intervals rather than a certain interval VG (refer to FIG. 10) according to each code. A range of the reference voltage Vref may be defined between a maximum value Vmax and a minimum value Vmin. Herein, a region may be divided through a first reference value V1 and a second reference value V3, which are located between the maximum value Vmax and the minimum value Vmin. A middle value Vmid is a central value between the maximum value Vmax and the minimum value Vmin. In general, a reference voltage Vref may be nearer to the middle value Vmid where a duty ratio of a comparison signal is 50%.

The first reference value V1 may be less than the second reference value V2. The first reference value V1 may be less than the middle value Vmid and may be greater than the minimum value Vmin. The second reference value V2 may be greater than the first reference value V1. The second reference value V2 may be greater than the middle value Vmid and may be less than the maximum value Vmax.

A first region I may be a region which is less than the first reference value V1 and is greater than or equal to the minimum value Vmin. A second region II may be a region which is greater than or equal to the first reference value V1 and is less than the second reference value V2. A third region III may be a region which is greater than or equal to the second reference value V2 and is less than or equal to the maximum value Vmax. Accordingly, the middle value Vmid may belong to the second region II.

A level conversion module 134 (refer to FIG. 9) may increase or decrease the reference voltage Vref at first intervals VG1 in the first region I. The level conversion module 134 may increase or decrease the reference voltage Vref at second intervals VG2 in the second region II. The level conversion module 134 may increase or decrease the reference voltage Vref at third intervals VG3 in the third region III.

The second intervals VG2 may be smaller than the first intervals VG1 and the third intervals VG3. The second region II is a region having a higher probability that the reference voltage Vref will have an optimum margin than the first region I and the third region III. Accordingly, levels of the reference voltage Vref in the second region II may be set to be closer to each other, thereby more accurately determining the levels of the reference voltage Vref. Because the first region I and the third region III have a lower probability that the reference voltage Vref will have the optimum margin in comparison with the second region II, they may have the first intervals VG1 and the third intervals VG3 which are greater than the second intervals VG2.

The first intervals VG1 and the third intervals VG3 may be identical to each other. However, the scope and sprit of the present disclosure may not be limited thereto.

For example, in case of having the same codes and the same number of levels of the reference voltage Vref, the second intervals VG2 in the second region II may be set closer to each other as compared to other regions, thereby resulting in more accurate training of the reference voltage Vref.

Hereinafter, a second reference voltage level changing unit of a reference voltage level training device according to another exemplary embodiment is disclosed with reference to FIGS. 12 to 14. Because the second reference voltage level changing unit denoted by 130-1 includes the same configurations as a first reference voltage level changing unit 130 (refer to FIG. 9) except for a digital filter 136, a description thereof will thus be omitted or briefly described.

Figure 12:
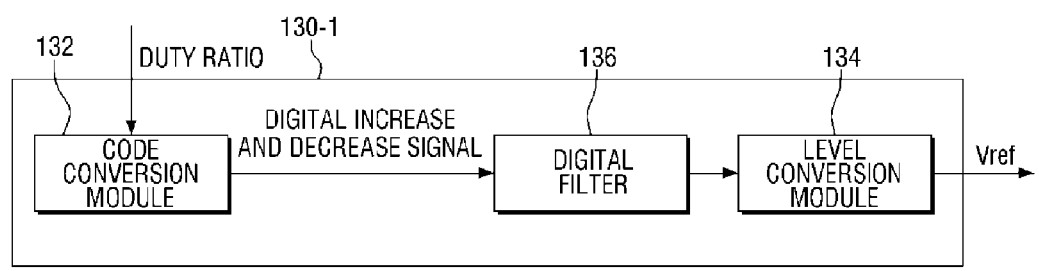
FIG. 12 is a block diagram illustrating a reference voltage level changing unit of a reference voltage training device according to another exemplary embodiment.

Referring to FIG. 12, the second reference voltage level changing unit 130-1 may further include the digital filter 136.

The digital filter 136 may receive a digital increase and decrease signal from a code conversion module 132. The digital filter 136 may transmit a filtered digital increase and decrease signal to a level conversion module 134.

When an error occurs in the digital increase and decrease signal, the digital filter 136 may filter the digital increase and decrease signal. A duty cycle detector 120 (refer to FIGS. 2 and 5) may output an analog signal. Accordingly, when the analog signal is changed due to a specific cause, the duty cycle detector 120 may provide an incorrect duty ratio to the code conversion module 132.

FIG. 13 is one exemplary table illustrating an operation of a digital filter of FIG. 12.

Referring to FIG. 13, an initial reference voltage Vref is a minimum value Vmin, and a second reference voltage level changing unit 130-1 (refer to FIG. 12) increases a level of the reference voltage Vref. In this embodiment, a duty ratio is continuously decreased, whereas in other embodiments, the duty ratio may be increased according to instability of an analog signal.

In this case, a digital filter 136 (refer to FIG. 12) may filter the increased duty ratio. For example, when a duty ratio is more than 50% in completed reference voltage training where the reference duty ratio is 50% or less, the digital filter 136 may stop further training by filtering the duty ratio that is more than 50%.

Referring to FIG. 14, an initial reference voltage Vref is a maximum value Vmax, and a second reference voltage level changing unit 130-1 (refer to FIG. 12) decreases the level of the reference voltage Vref. Though duty ratio is presumably increased, there may be a case where the duty ratio is decreased due to instability of an analog signal.

In this case, a digital filter 136 (refer to FIG. 12) may filter the decreased duty ratio. For example, when a duty ratio is less than 50% in completed reference voltage training where the reference duty ratio is 50% or more, the digital filter 136 may stop further training procedure by filtering the duty ratio that is less than 50%.

Figure 15:
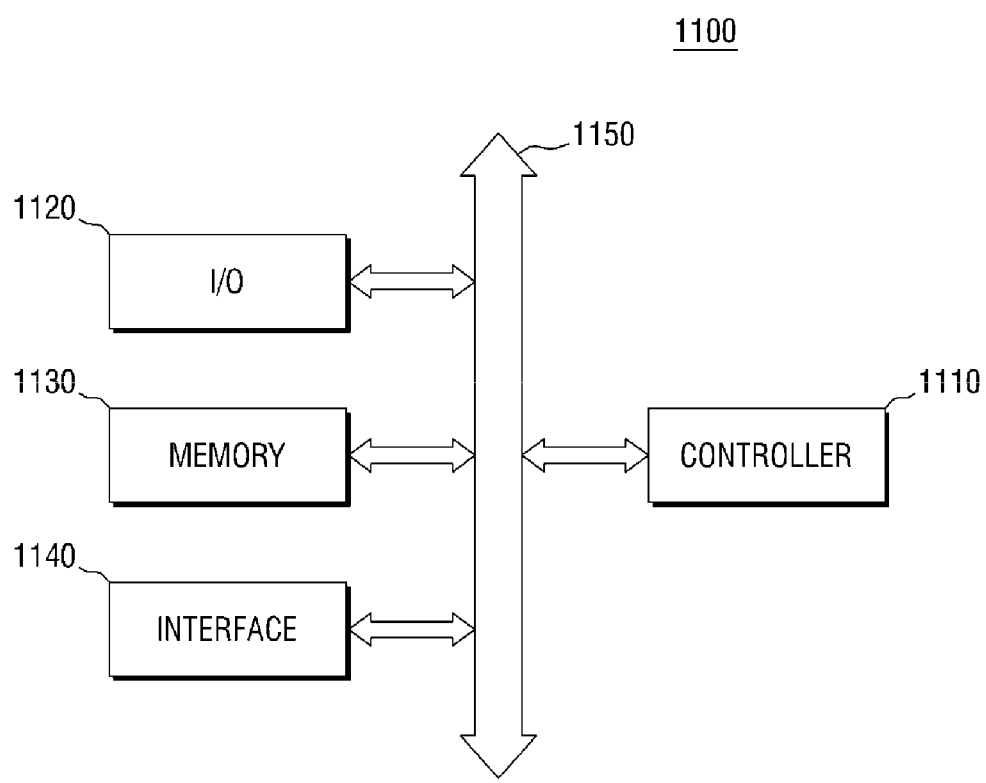
FIG. 15 is a block diagram illustrating a configuration of an electronic system including a reference voltage training device according to an exemplary embodiment.

Referring to FIG. 15, the electronic system denoted by 1100 according to an exemplary embodiment of the present disclosure may include a controller 1110, an input and output (I/O) device 1120, a memory 1130, an interface 1140, and a bus 1150. The controller 1110, the I/O device 1120, the memory 1130, and/or the interface 1140 may be coupled to each other through the bus 1150. The bus 1150 may correspond to a path in which data are moved.

The controller 1110 may include at least one of a microprocessor, a digital signal processor, a microcontroller, and logic devices which may perform functions which are similar to the aforementioned microprocessor, digital signal processor, and microcontroller. The I/O device 1120 may include a keypad, a keyboard, a display device, etc. The memory 1130 may store data and/or instructions, etc. The memory 1130 may include a semiconductor device according to some embodiments of the present disclosure. The memory 1130 may, for example, include a dynamic random access memory (DRAM). The memory 1130 may include a reference voltage training device according to various embodiments of the present disclosure.

The interface 1140 may perform a function for transmitting data to a communication network or for receiving data from the communication network. The interface 1140 may be of a wired or wireless type. For example, the interface 1140 may include an antenna or a wired and wireless transceiver, etc.

The electronic system 1100 may be applied to a personal digital assistant (PDA), a portable computer, a web tablet, a wireless phone, a mobile phone, a digital music player, a memory card, or any other electronic product which may transmit or receive information in wireless environments.

Figure 16:
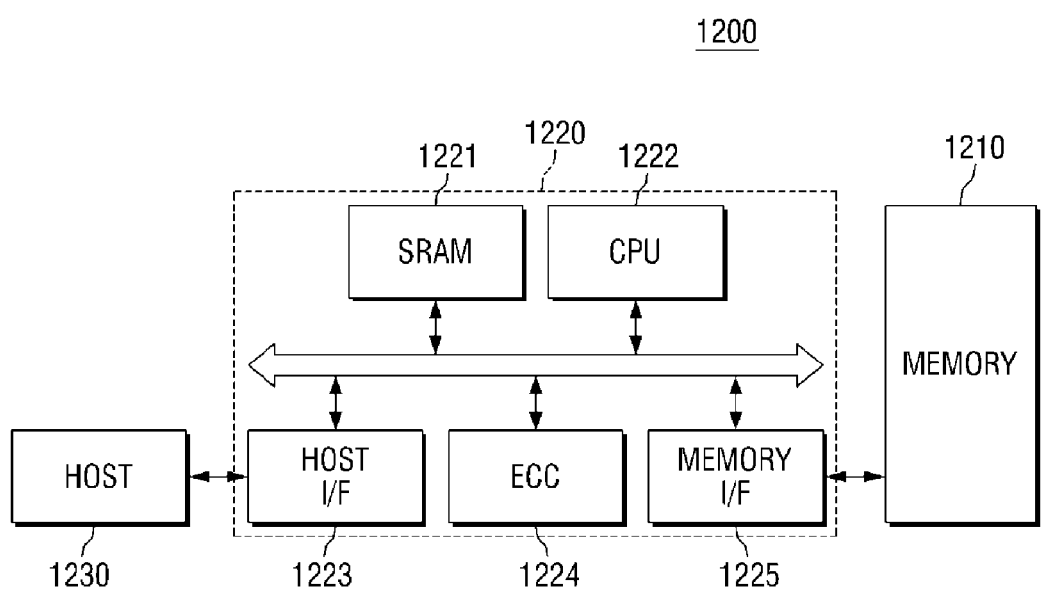
FIG. 16 is a block diagram illustrating a configuration of a memory card including a reference voltage training device according to an exemplary embodiment.

Referring to FIG. 16, a memory 1210, including a reference voltage training device according to various embodiments of the present disclosure, may be included in a memory card 1200. The memory card 1200 may include a memory controller 1220 which controls data exchange between a host 1230 and the memory 1210. In some embodiments, a static RAM (SRAM) 1221 may be used as an operating memory of a central processing unit (CPU) 1222. A host interface (I/F) 1223 may include a protocol for connecting to the memory card 1200 and exchanging data. An error correction code (ECC) unit 1224 may detect an error of data read out from the memory 1210 and may correct the detected data. A memory I/F 1225 may interface with the memory 1210. The CPU 1222 may an overall control operation associated with data exchange of the memory controller 1220.

Figure 17:
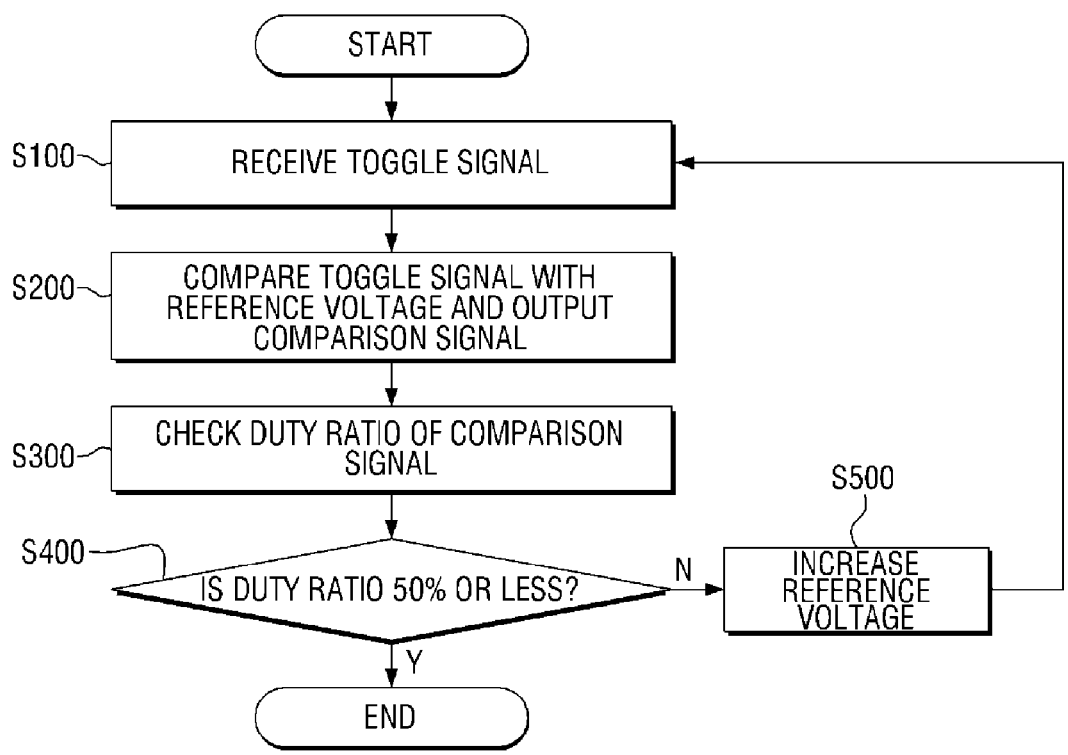
FIG. 17 is a flowchart illustrating a reference voltage training method according to an exemplary embodiment.

FIG. 17 is a flowchart illustrating a reference voltage training method according to an exemplary embodiment.

Referring to FIG. 17, a toggle signal may be received (S100).

For example, a memory controller 20 (refer to FIG. 1) may transmit a toggle signal to a memory 10 (refer to FIG. 1). In some embodiments, the memory 10 may receive the transmitted toggle signal (S100).

The memory 10 may include a first reference voltage training device 100 (refer to FIG. 1). The first reference voltage training device 100 may receive the toggle signal from the memory controller 20. The first reference voltage training device 100 may train a reference voltage using the toggle signal.

A comparator 110 (refer to FIGS. 2 and 5) may compare the toggle signal with the reference signal and output the compared result as a comparison signal (S200).

For example, a toggle signal IN and a reference voltage Vref may be input to input terminals of the comparator 110. Because the description is given for the next operation in embodiments shown in FIGS. 2 to 4, no detailed description of the same configurations will be provided.

A duty cycle detector 120 (refer to FIGS. 2 and 5) may check a duty ratio of the comparison signal (S300).

A phase converter 140 (refer to FIG. 5) may receive the comparison signal from the comparator 110 and may output the received comparison signal without change. The phase converter 140 may also output an inverted phase signal having a phase inverted from that of the comparison signal.

A DCC pump module 122 (refer to FIG. 7) of the duty cycle detector 120 may receive the comparison signal and the inverted phase signal from the phase converter 140, and may pump the comparison signal and the inverted phase signal. A DCC comparison module 124 (refer to FIG. 7) may compare the comparison signal with the inverted phase signal. The DCC comparison module 124 may detect a duty ratio according to a ratio of a gap G to a period The duty cycle detector 120 may determine whether the duty ratio is 50% or less (S400).

A code conversion module 132 (refer to FIG. 9) may receive the duty ratio and may generate a digital increase and decrease signal. The code conversion module 132 may transmit the digital increase and decrease signal to a level conversion module 134 (refer to FIG. 9). The level conversion module 134 may convert a level of the reference voltage Vref according to the digital increase and decrease signal.

The reference voltage Vref may be set in advance to correspond to a code at a certain interval VG. As such, when the reference voltage Vref is changed at the certain interval VG, a reference voltage Vref having an optimum duty ratio may be detected intuitively and simply, thereby minimizing an amount of computation therefor.

Intervals may be closer to each other near a middle value. In this case, a level of the reference voltage Vref may be trained more accurately.

The output reference voltage may be input to an input terminal of the comparator 110. Therefore, the comparator 110 may output a changed comparison signal according to a changed reference voltage. The duty cycle detector 120 may measure a duty ratio of the changed comparison signal and may transmit the measured result to a first reference voltage level changing unit 130 (refer to FIGS. 2 and 5). Accordingly, the first reference voltage level changing unit 130 may change a level of the reference voltage Vref according to whether the duty ratio meets a predetermined condition. Alternatively, the first reference voltage level changing unit 130 may fix the level of the reference voltage Vref by completing reference voltage training A digital filter 136 (refer to FIG. 12) may receive the digital increase and decrease signal from a code conversion module 132 (refer to FIG. 12). The digital filter 136 may transmit a filtered digital increase and decrease signal to the level conversion module 134. When an error occurs in the digital increase and decrease signal, the digital filter 136 may filter the digital increase and decrease signal.

If the duty ratio is 50% or less, the first reference voltage level changing unit 130 may complete reference voltage training by saving a current level of the reference voltage and fixing the reference voltage as a final reference voltage. If the duty ratio is more than 50% (S400, No), the first reference voltage level changing unit 130 may increase the reference voltage (S500).

A toggle signal may be received (S100), and the comparator 110 may compare the increased reference voltage with the toggle signal and outputs a changed comparison signal (S200). For example, the first reference voltage level changing unit 130 may change a level of the reference voltage until the duty ratio is 50% or less.

While the present disclosure has been particularly shown and described with reference to exemplary embodiments thereof, it will be understood by those of ordinary skill in the art that various changes in form and details may be made therein without departing from the spirit and scope of the present disclosure, as defined by the following claims. It is therefore desired that the present embodiments be considered in all respects as illustrative and not restrictive, reference being made to the appended claims rather than the foregoing description to indicate the scope of the invention.

What is claimed is:

1. A reference voltage training device comprising:
    a comparator configured to compare a toggle signal with a reference voltage and output a comparison signal;
    a phase converter configured to shift a phase of the comparison signal and output an inverted phase signal;
    a duty cycle detector configured to measure a duty ratio of the comparison signal by comparing the comparison signal with the inverted phase signal; and
    a reference voltage level changing unit configured to fix the reference voltage when the duty ratio meets a predetermined condition and, when the duty ratio does not meet the predetermined condition, to modify a level of the reference voltage and output a changed reference voltage,
    wherein the comparator outputs a changed comparison signal using the changed reference voltage.

2. The reference voltage training device of claim 1, wherein the reference voltage first has a minimum value, and
    wherein the reference voltage level changing unit increases a level of the reference voltage when the duty ratio does not meet the predetermined condition.

3. The reference voltage training device of claim 2, wherein the predetermined condition includes a condition where the duty ratio is 50% or less.

4. The reference voltage training device of claim 1, wherein the reference voltage first has a maximum value, and
    wherein the reference voltage level changing unit decreases a level of the reference voltage when the duty ratio does not meet the predetermined condition.

5. The reference voltage training device of claim 4, wherein the predetermined condition includes a condition where the duty ratio is 50% or more.

6. The reference voltage training device of claim 1, wherein the reference voltage level changing unit increases or decreases the level of the reference voltage according to a predefined time interval.

7. The reference voltage training device of claim 6, wherein the reference voltage level changing unit increases or decreases the level of the reference voltage according to a constant time interval.

8. The reference voltage training device of claim 6, wherein the level of the reference voltage comprises:
a first region between a minimum value and a first reference value;
a second region between the first reference value and a second reference value; and
a third region between the second reference value and a maximum value,
wherein the first reference value is located between a middle value and the minimum value,
wherein the second reference value is located between the middle value and the maximum value,
wherein the reference voltage level changing unit increases or decreases the level of the reference voltage at first intervals and third intervals in the first region and third region respectively,
wherein the reference voltage level changing unit increases or decreases the level of the reference voltage at second intervals in the second region, and
wherein the second intervals are smaller than the first intervals or the third intervals.

9. The reference voltage training device of claim 1, wherein the reference voltage level changing unit comprises:
a code conversion module configured to generate a digital increase and decrease signal of a reference voltage level based on the measured duty ratio; and
a level conversion module configured to increase or decrease the level of the reference voltage according to the digital increase and decrease signal.

10. The reference voltage training device of claim 9, further comprising:
a digital filter configured to filter the digital increase and decrease signal when the duty ratio does not meet the predetermined condition, after the level of the reference voltage is changed.

11. The reference voltage training device of claim 1, wherein the duty cycle detector comprises:
a duty cycle correction (DCC) pump module configured to boost the comparison signal and the inverted phase signal; and
a DCC comparison module configured to measure the duty ratio by comparing the boosted comparison signal with the boosted inverted phase signal.

12. A reference voltage training device comprising:
a reference voltage level changing unit configured to change a level of a reference voltage to a predetermined level through multiple steps;
a comparator configured to compare the reference voltage with a toggle signal and output a comparison signal;
a phase converter configured to shift a phase of the comparison signal and output an inverted phase signal; and
a duty cycle detector configured to measure a duty ratio of the comparison signal by comparing the comparison signal with the inverted phase signal,
wherein the reference voltage is fixed when the duty ratio is located within a reference range.

13. The reference voltage training device of claim 12, wherein the reference range is 50%.

14. The reference voltage training device of claim 12, wherein the toggle signal has a slope between a high-level signal and a low-level signal.

15. A reference voltage training device comprising:
a memory configured to include a reference voltage training device; and
a memory controller configured to transmit a toggle signal to the reference voltage training device,
wherein the reference voltage training device compares the toggle signal with an initial reference voltage and outputs a comparison signal, shifts a phase of the comparison signal and outputs an inverted phase signal, measures a duty ratio of the comparison signal by comparing the comparison signal with the inverted phase signal, fixes the initial reference voltage to a reference voltage when the duty ratio meets a predetermined condition, and changes the initial reference voltage when the duty ratio does not meet the predetermined condition and outputs a changed comparison signal.

16. The reference voltage training device of claim 15, wherein the initial reference voltage is a minimum value of the reference voltage, and
wherein the reference voltage training device increases a level of the reference voltage when the duty ratio does not meet the predetermined condition.

17. The reference voltage training device of claim 16, wherein the reference voltage training device does not decrease a level of the reference voltage.

18. The reference voltage training device of claim 16, wherein the predetermined condition is a condition where the duty ratio is 50% or less.

19. The reference voltage training device of claim 15, wherein the memory includes a random access memory (RAM).

20. The reference voltage training device of claim 15, wherein the initial reference voltage is a maximum value of the reference voltage, and
wherein the reference voltage training device decreases a level of the reference voltage when the duty ratio does not meet the predetermined condition.

* * * * *